United States Patent
Xuan et al.

(10) Patent No.: US 7,767,996 B2
(45) Date of Patent: Aug. 3, 2010

(54) LIGHT-EMITTING DEVICE WITH MAGNETIC FIELD

(75) Inventors: Rong Xuan, Taipei County (TW); Chih-Hao Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/146,418

(22) Filed: Jun. 25, 2008

(65) Prior Publication Data

US 2009/0179217 A1   Jul. 16, 2009

Related U.S. Application Data

(63) Continuation-in-part of application No. 12/117,747, filed on May 9, 2008.

(60) Provisional application No. 61/020,397, filed on Jan. 11, 2008.

(51) Int. Cl.
*H01L 31/00* (2006.01)

(52) U.S. Cl. .............. 257/13; 257/94; 257/99; 257/E33.001; 257/E33.064

(58) Field of Classification Search .......... 257/79, 257/13, 98, 425, E33.059, 94, 99, E33.001, 257/E33.064; 438/29
See application file for complete search history.

(56) References Cited

U.S. PATENT DOCUMENTS

| | | | |
|---|---|---|---|
| 4,450,460 A | 5/1984 | Morimoto | |
| 5,874,749 A * | 2/1999 | Jonker | 257/98 |
| 6,621,100 B2 * | 9/2003 | Epstein et al. | 257/40 |
| 2005/0238076 A1 * | 10/2005 | Kuwata et al. | 372/50.1 |
| 2006/0256825 A1 * | 11/2006 | Matsumura et al. | 372/43.01 |

OTHER PUBLICATIONS

Sze, "Semiconductor Devices. Physics and Technology", 2002, Jon Willey & Sons, pp. 291-292.*
Dunkin et al., "Handbook of Optoelectronics. vol. 1", 2006, Informa, Taylor & Francis Group, pp. 358-359.*
Article titled "Two-Dimensional Quantum-Mechanical Confinement of Electrons in LED by Strong Magnetic Fields" authored by Arakawa et al., IEEE Transactions on Electron Devices, vol. ED-30, No. 4, Apr. 1983, pp. 330-334.

* cited by examiner

*Primary Examiner*—Thomas L Dickey
*Assistant Examiner*—Nikolay Yushin
(74) *Attorney, Agent, or Firm*—Jianq Chyun IP Office (57) ABSTRACT

A light-emitting device with magnetic-source includes a light emitting stack structure. The light emitting stack structure has a first electrode and a second electrode distributed at a light output side of the light emitting stack structure. A magnetic-source layer is engaged with the light emitting stack structure to provide a magnetic field to the light emitting stack structure in a substantially perpendicular direction to the light emitting stack structure. Alternatively, a method for improving light emitting performance of a light-emitting device includes applying a magnetic field to the light-emitting device at a direction substantially perpendicular to a light emitting area of the light-emitting device.

19 Claims, 6 Drawing Sheets

LIGHT-EMITTING DEVICE WITH MAGNETIC FIELD

CROSS-REFERENCE TO RELATED APPLICATION

This application is a continuation-in-part application of Ser. No. 12/117,747, filed on May 9, 2008, now pending, which claims the priority benefit of U.S. provisional application Ser. No. 61/020,397, filed on Jan. 11, 2008. The entirety of each of the above-mentioned patent applications is hereby incorporated by reference herein and made a part of this specification.

BACKGROUND OF THE INVENTION

1. Field of Invention

The present invention relates to light-emitting device. More particularly, the present invention relates to light-emitting device with magnetic field.

2. Description of Related Art

Light emitting device, such as a light emitting diode (LED) can emit light due to the driving of electron and holes through the active layer of the light emitting diode. However, if current density is not uniformly distributed to the whole light emitting area, the light uniformity is reduced. Even further, the non-transparent top electrode, in conventional design, is usually positioned at the center region of the light emitting area. In this manner, the current density under the top electrode is larger than the other region and can emit more light. However, the emitted light under the top electrode is blocked since the top electrode is not transparent to the light. The top electrode of the conventional LED blocks the emitted light at the central region with the highest intensity, resulting in reduction of the output light.

How to improve the light output efficiency of the LED still need further development in the field of the art.

SUMMARY OF THE INVENTION

The invention provides a light-emitting device with magnetic-source. The light-emitting device includes a light emitting stack structure. The light emitting stack structure has a first electrode, a second electrode, a lower doped stack layer, an upper doped stack layer, an active layer between the lower and upper doped stack layers. The first electrode and the second electrode are disposed on a same side of the light emitting stack structure, for producing a driving current. A magnetic-source layer provides a magnetic field to the light emitting stack structure in a direction substantially perpendicular to the upper doped stack layer.

The invention provides a light-emitting device with magnetic-source includes a light emitting stack structure. The light emitting stack structure has a first electrode and a second electrode distributed at the same side of the light emitting stack structure. A magnetic-source layer is engaged with the light emitting stack structure to provide a magnetic field to the light emitting stack structure in a substantially perpendicular direction to the light emitting stack structure.

The invention provides a method for improving light emitting performance of a light-emitting device includes applying a magnetic field to the light-emitting device at a direction substantially perpendicular to a light emitting area of the light-emitting device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention proposes a light emitting device, in which a magnetic field is applied, perpendicularly to the light emitting area to improve the light outputting efficiency. Several embodiments are provided for describing the present invention. However, the present invention is not just limited to the embodiments. Further, the embodiments to each other can also be properly combined to have other embodiments.

In physical phenomenon, the Hall effect is well known that when a current flow through a conductive line and an external magnetic field is applied transversely, then the path of the current is also transversely shifted due to magnetic Lorenz force of $F=-q \times V \times B$. The present invention involves the consideration of the Hall effect and implements the Hall effect into the LED.

Figure 1:
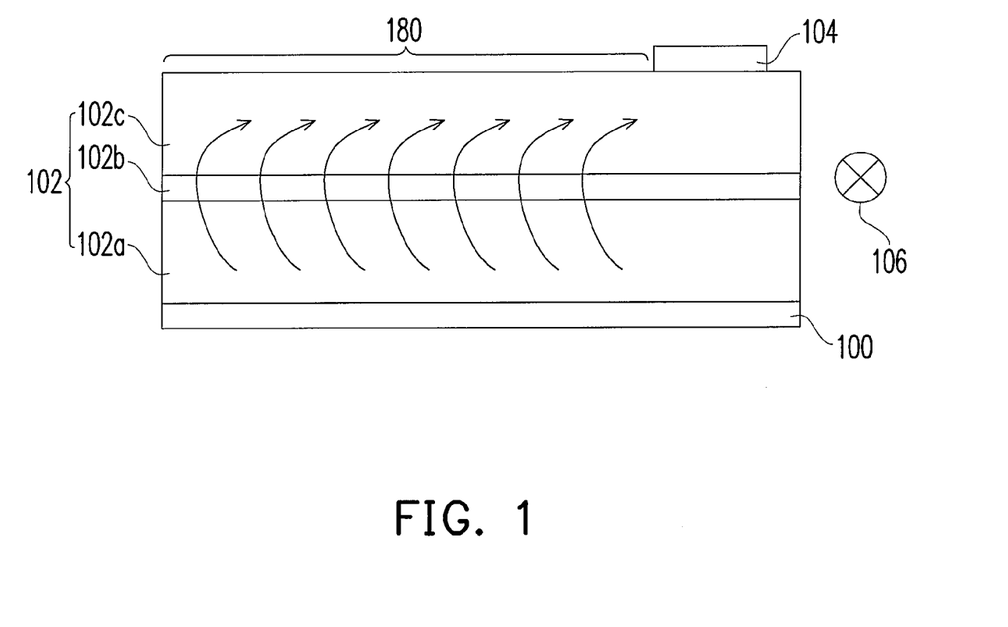
FIG. 1 is a cross-sectional view, schematically illustrating a mechanism for a structure of a light emitting diode with the magnetic field, according to an embodiment of the present invention.

FIG. 1 is a cross-sectional view, schematically illustrating a structure of a light emitting diode with the magnetic field, according to an embodiment of the present invention. In FIG. 1, a light emitting diode is taken as the example. The light emitting diode includes, for example, a bottom electrode 100, a light-emitting structure 102, a top electrode 104. The light-emitting structure 102 includes, for example, a first doped semiconductor layer 102$a$, such as P-dope layer, an active layer 102$b$ for emitting light based on combination of electrons and electron-holes, and second doped semiconductor layer 102$c$, such as N-doped layer. The top electrode 104 can be, for example, not position at the center of the light emitting area 108.

When in operation the current is flowing from the bottom electrode 100 to the top electrode 104. However, if an external magnetic field in a direction, such as an indication to go in the paper as indicated by notation 106, is transversely applied, the Lorenz force is produced to shift and spread the current. Here, FIG. 1 is an example. The conductive types of electrodes and the direction of magnetic field can be changed according to the actual design, while the concept remains the same. As a result, the current are transversely shifted and can still flow from the bottom electrode to the top electrode, which is at the side region of the light emitting area 180. The driving current can more effectively cause the active layer 102$b$ to emit light.

For the structure in FIG. 1, the two electrodes 100 and 104 are at opposite sides of the light-emitting structure 102, and then the magnetic field is applied parallel to the light emitting area 180, in which the driving current is shifted inside light-emitting structure 102. However, when the electrode is arranged at the same side of the light-emitting structure, a large horizontal-component current is produced, and the direction of magnetic field should be accordingly changed.

Figure 2A:
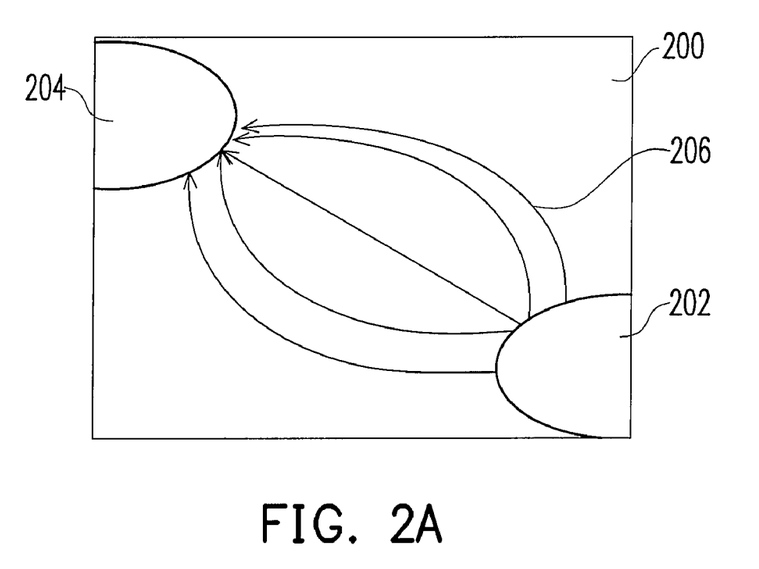
FIGS. 2A-2B are top views, schematically illustrating a mechanism for a structure of a light emitting diode with the magnetic field, according to an embodiment of the present invention.
Figure 2B:
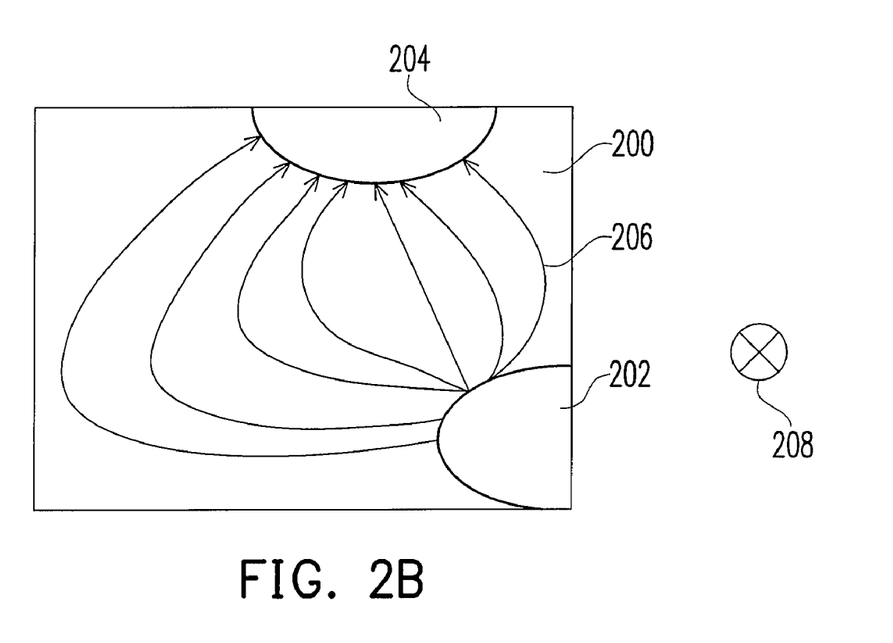

FIGS. 2A-2B are top views, schematically illustrating a mechanism for a structure of a light emitting diode with the magnetic field, according to an embodiment of the present invention. In FIG. 2A, taking a light emitting structure 200 in a rectangular shape as an example, two electrodes 202 and 204 are located at the diagonal corners. When a proper voltage is applied, the current 206 is concentrated in a region having the shortest path, causing non-uniform current density. In FIG. 2B, when a magnetic field 208 is applied at a direction perpendicular to the light emitting structure 200, then the Lorenz fore causes the current 206 to shift. As a result, the current 206 can spread and more evenly distribute in the whole area of the light emitting structure 200. This indicates that the light emitting area can increase and the light is not over concentrated to a local area. However, the location of the electrode 204 is changed in accordance with the applied magnetic field.

Figure 3:
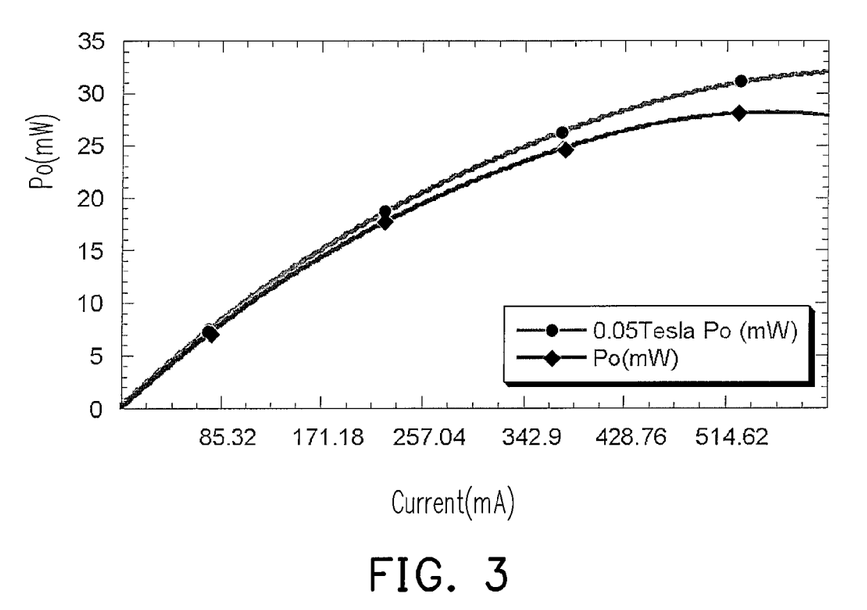
FIGS. 3-4 are drawings, schematically illustrating the improvements due to applying magnetic field on the light-emitting device, according to the present invention.
Figure 4:
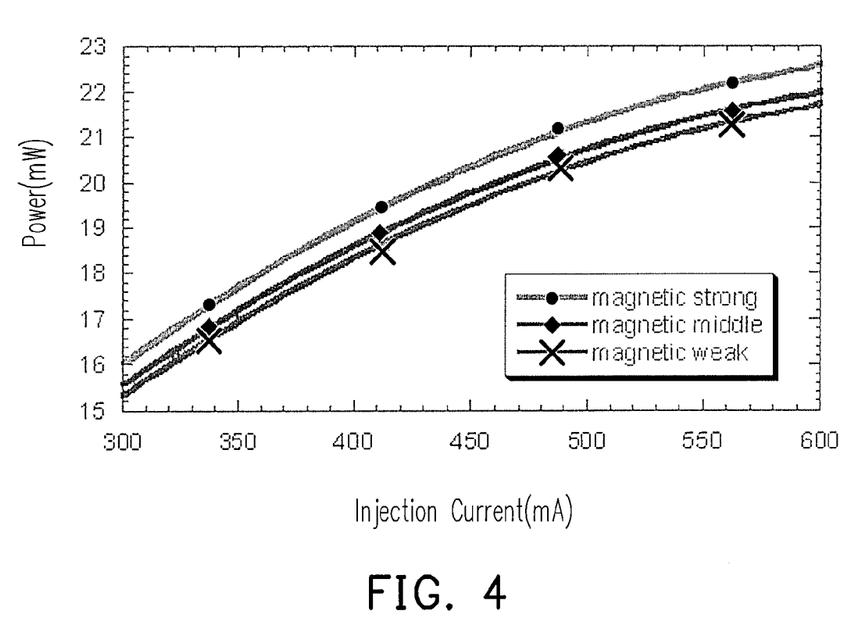

FIGS. 3-4 are drawings, schematically illustrating the improvements due to applying magnetic field on the light-emitting device, according to the present invention. In FIG. 3, the investigated data shows that the output power (Po) can increase when the magnetic field is applied. The curve with diamond dots is the output power without magnetic field while the curve with round dots is the output power with magnetic field of 0.05 Tesla. The improvement of output power can also be observed in relating to the injection current. In FIG. 4, the curves with higher applied magnetic fields have larger output power, as well. In other words, the mechanism in FIG. 2 can indeed improve the output power. Based on this mechanism proposed by the present invention, several embodiments in accordance with different design are described. However, the present invention is not just limited to the embodiments. Further, the provided embodiments can also be properly combined to each other for other embodiments.

Figure 5:
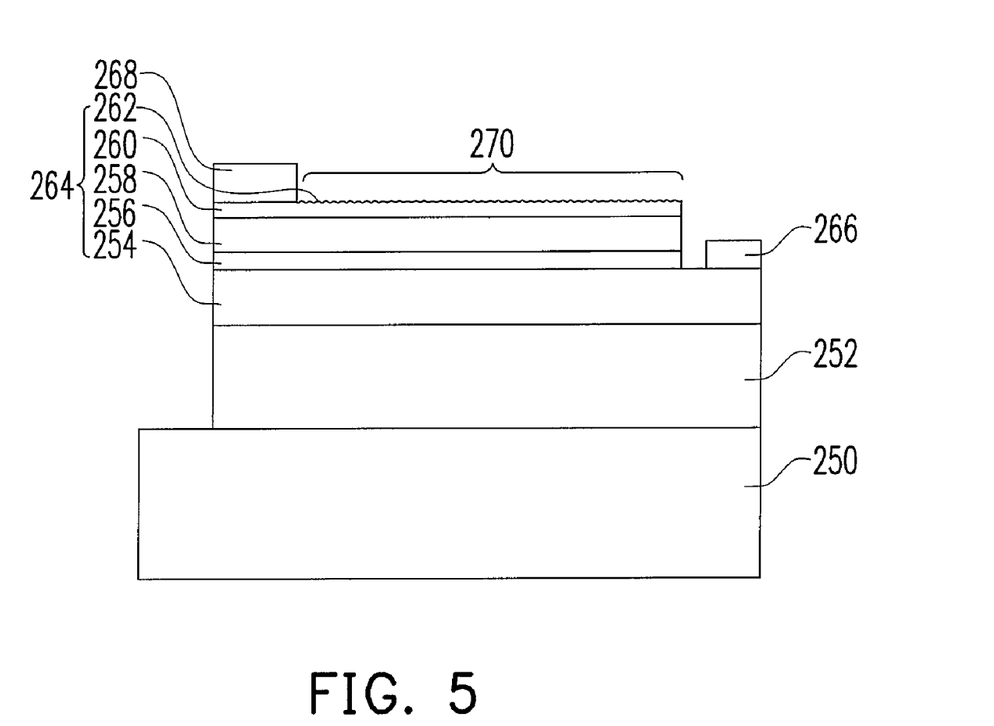
FIGS. 5-9 are cross-sectional views, schematically illustrating structures of light emitting device, according to embodiments of the present invention.

FIGS. 5-9 are cross-sectional views, schematically illustrating structures of light emitting device, according to embodiments of the present invention. In FIG. 5, a light-emitting structure can include the basic structure 264, disposed on a substrate 252. The basic structure 264 can include, for example, a bottom doped layer 254, which can be organic/in-organic semiconductor or any suitable doped materials used for emitting light. The basic structure 264 may include, for example, a bottom doped stack layer 254, an active layer 256, an upper doped stack layer 258. Here, the bottom doped stack layer 254 and the upper doped stack layer 258 are in different conductive types. However, depending on the operation voltage, the bottom doped stack layer 254 or the upper doped stack layer 258 can be p-type or n-type. In addition, due to for example the relative poor contact between the electrode and the doped semiconductor material, the transparent conductive layer (TCL) 260 may also included, for example. In addition, in order to have better performance of light output in the light emitting area 270, a rough surface 262 can be formed, which is for example formed on the TCL 260 or on the upper doped stack layer 258. Actually, the rough surface 262 can be at any proper surface depending on the light output direction. The two electrodes 266 and 268, respectively disposed on the bottom doped stack layer 254 and the upper doped stack layer 258, are at the same side of the light-emitting structure, that is also called horizontal-type light emitting device. In this horizontal design, there is a horizontal component of driving current in the upper doped stack layer 258 or even in the TCL 260 if the TCL is included.

In the present invention, a magnetic-source layer 250 is additional added and is implemented on the substrate 252 at the other side. The magnetic-source layer 250 is used to produce a magnetic field so as to redistribute the current density of the horizontal component in the upper doped stack layer 258, based on the mechanism of FIG. 2B. The magnetic-source layer 250 can, for example, be an artificial ferromagnetic layer with the magnetization to provide a magnetic field substantially perpendicular to the light emitting area 270, so as to redistribute the current density of the horizontal component. The locations of the electrodes 266 and 268 are set in accordance the magnetic field be produced. It can be understood that the magnetic-source layer 250 is used to produce the intended magnetic field for shift the driving current, and any proper modified design can be implemented. The magnetic-source layer 250 can also serves as another substrate. Even for example, the magnetic-source layer 250 can be an external structure or unit without physically contact. In other words, magnetic-source layer 250 can be an external unit for applying the magnetic field or an integrated structure layer in the light emitting structure.

Figure 6:
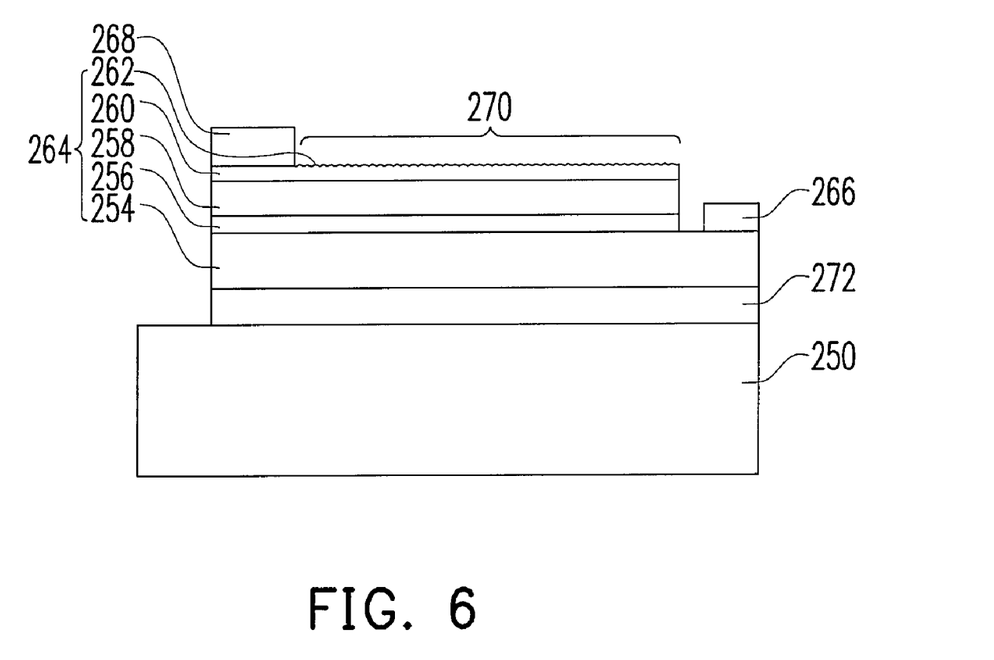
Figure 7:
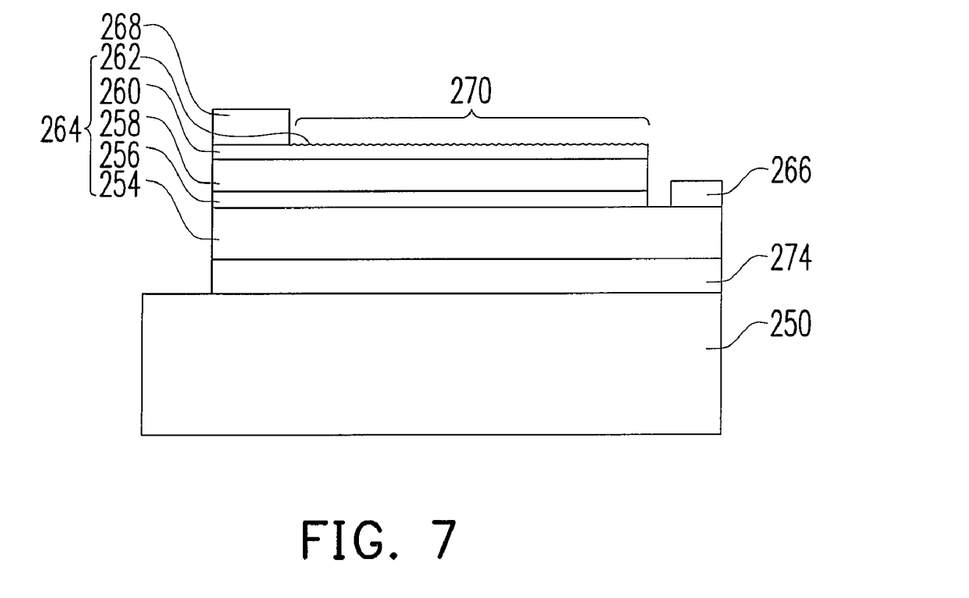

Based on the same concept of the mechanism, the structure in FIG. 5 can be modified as shown in FIG. 6, for example. In FIG. 6, the substrate 252 in FIG. 5 can be changed as a reflection layer 272. The reflection layer 272 can be, for example, a metal layer or made by other manner to form the reflection property. The light output can be increased. In FIG. 7, even further, the reflection layer 272 can be, for example, replaced by insulating layer 274 with reduced thickness or reflection layer in reduced thickness. It can be understood that the embodiments in FIGS. 5-7 are just the examples. The present invention is not jest limited to the embodiments.

In foregoing embodiments, the magnetic-source layer 250 is implemented at the bottom. However, the magnetic-source layer 250 can be implemented at the upper side. Since the surface level at the upper side of the light emitting structure is usually not planar, the magnetic-source layer can be implemented by, for example, packaging manner.

Figure 8:
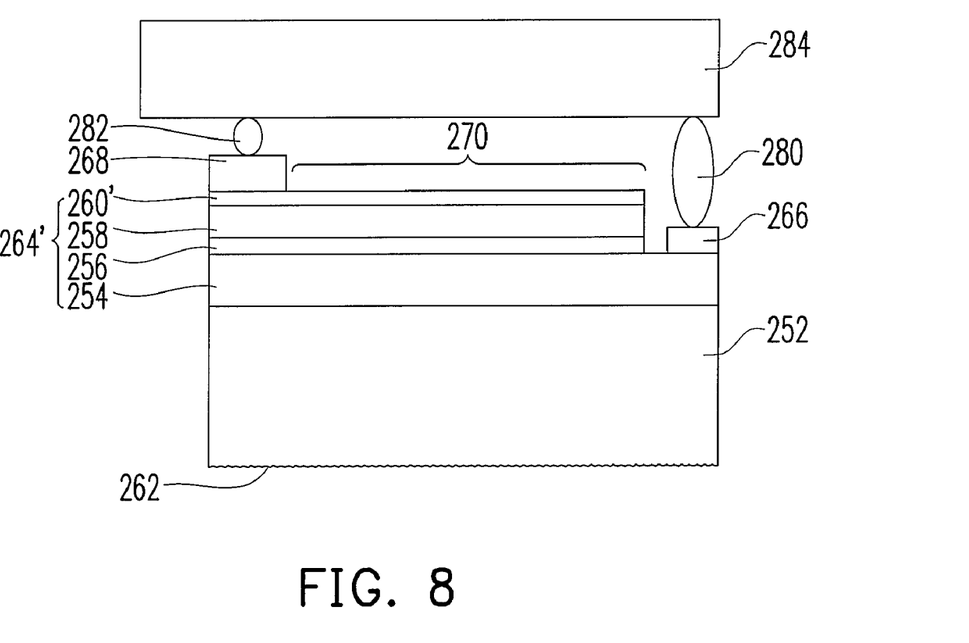

In FIG. 8, the magnetic-source layer 284 can be implemented by bonding bumps 280 and 282 by flip-chip packaging process, known in the art. Here, when considering the light output direction, which is toward the transparent substrate 252, the rough surface 262 can be formed on the outer surface of the substrate 252 and a reflection layer 260', such as a metal layer, can be implemented in the basic structure 264'. However, it is not the only packaging manner to implement the magnetic-source layer 284.

Alternatively, for example, the bonding bumps 280 and 282 can be omitted, and the electrodes 266 and 268 can be fabricated to have the same height by, for example, plating or any proper semiconductor fabrication process. Because the electrodes 266 and 268 have the same height, the magnetic-source layer 284 can then be directly adhered to the electrode, for example. In other words, the magnetic-source layer 284 can be formed by any proper manner.

Even further for example, the structure in FIG. 8 can be combined with FIG. 5 by adding the magnetic-source layer 250 at bottom, as well. As a result, two magnetic-source layers can be implemented.

Figure 9:
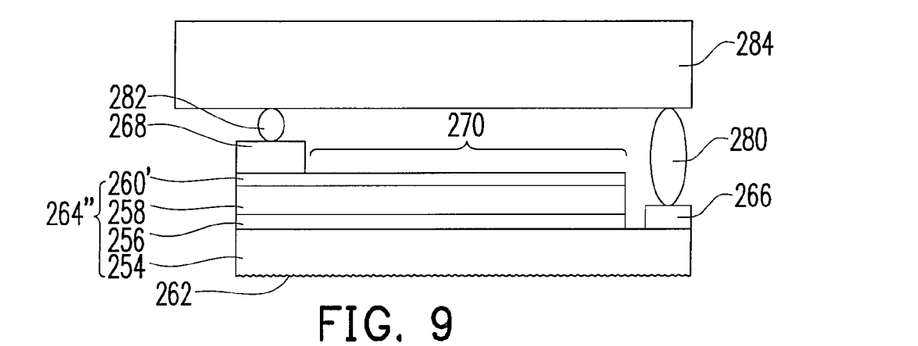

In FIG. 9, alternatively, the magnetic-source layer 284 can also serve as the substrate. In this situation, the basic structure 264" can be packaged with the magnetic-source layer 284 as previously described. Like FIG. 8, the reflection layer 260' is implemented in the basic structure 264". In addition, the bottom doped layer 254 has the rough surface 262. As a result, the light can go through the rough surface 262 in better performance.

Again, the foregoing embodiments are just the examples. In addition, all the embodiments can be properly combined into another embodiment.

In the following descriptions, the locations of the electrodes are described.

Figure 10:
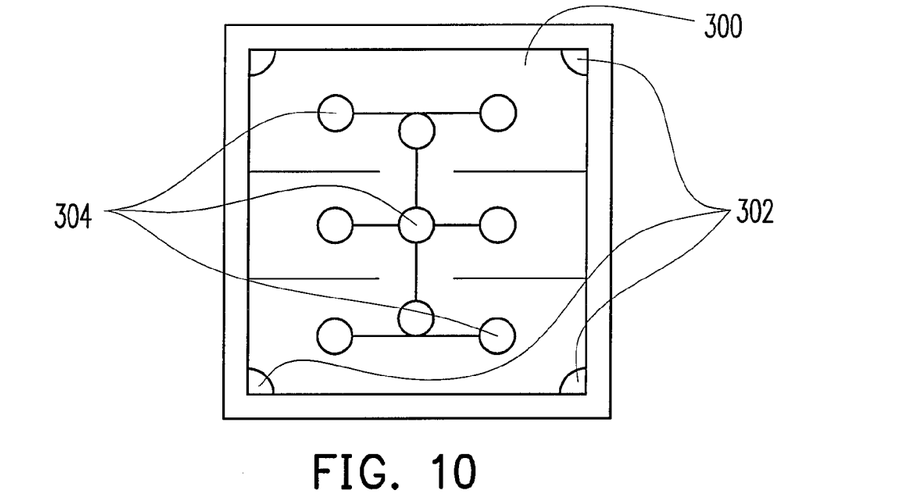
FIGS. 10-11 are top views, schematically illustrating structures of light emitting device for setting the electrodes, according to embodiments of the present invention.
Figure 11:
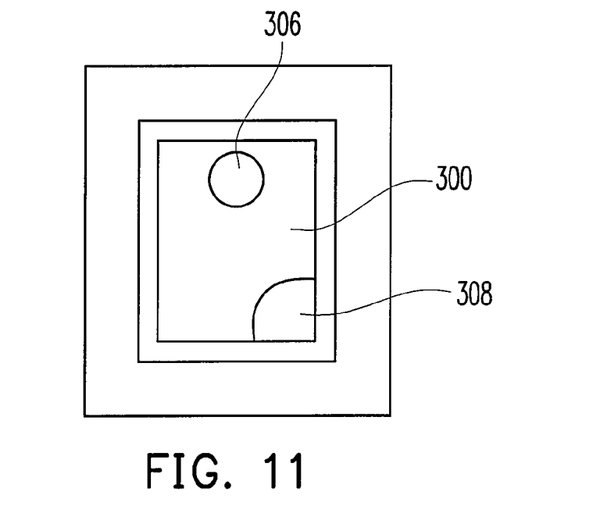

FIGS. 10-11 are top views, schematically illustrating structures of light emitting device for setting the electrodes, according to embodiments of the present invention. In FIG. 10, for light emitting device 300, the two electrodes 302 and 304 may have the line patterns, which are connected to the upper and bottom doped stack layers. However, in the top view, the two line patterns have portions interposed to each other. In this electrode structure, the two electrodes 302 and 304 are not totally symmetric. In one example, the gap distance between the line branches of the two line patterns can be not always the same as a constant in alternative option. In FIG. 11, another design of electrodes 306 and 308, in which the electrode 306 is not located at the diagonal corner to the electrode 308. This kind of electrode design is based on the magnetic field to be applied. The strength and direction of the magnetic field may cause the different result. Particularly in FIG. 11, if the magnetic field is applied, as similarly described in FIG. 2A or FIG. 2B, the electrode 306 is not at the symmetric locations in accordance with the magnetic field.

Based on the electrodes in FIG. 10 and FIG. 11, the investigations have been done. The magnetic field of 420 mT at perpendicular direction and a driving current of 200 mA are, for example, applied. In comparing with the situation without magnetic field, the structure in FIG. 10 can have about 12% improvement on output power. Taking the electrode in FIG. 11, the improvement can also have about 5.6%. From the investigation, the added magnetic field in the present invention can indeed improve the performance, in which the locations of the electrode are accordingly set.

In alternative aspect based on the operation method, the present invention can be a method for improving light emitting performance of a light-emitting device, which includes applying a magnetic field to the light-emitting device at a direction substantially perpendicular to a light emitting area of the light-emitting device. As an example, the way to apply the magnetic field can include integrating a magnetic sourcing layer into the light-emitting device, wherein the magnetic sourcing layer produces the magnetic field. In another example, the magnetic field can be externally applied.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A light-emitting device, having magnetic-source, comprising:
a light emitting stack structure, having a first electrode, a second electrode, a lower doped stack layer, an upper doped stack layer, an active layer between the lower and upper doped stack layers, wherein the first electrode and the second electrode are disposed on a same side of the light emitting stack structure, for producing a driving current; and
a magnetic-source layer, providing a magnetic field to the light emitting stack structure in a direction substantially perpendicular to the upper doped stack layer,
wherein the first electrode has a first line pattern and the second electrode has a second line pattern, portions of the first line pattern and the second line pattern are interposed at locations in accordance with the magnetic field, wherein a line gap between line branches of the first line pattern and the second line pattern is not constant.

2. The light-emitting device of claim 1, wherein the lower doped stack layer has a conductive type of n-type or p-type.

3. The light-emitting device of claim 1, further comprising a substrate, wherein the light emitting stack structure is disposed on a first side of the substrate and the magnetic-source layer is disposed on a second side of the substrate.

4. The light-emitting device of claim 1, further comprising a reflecting layer, wherein the light emitting stack structure is disposed on a front-side of the reflecting layer and the magnetic-source layer is disposed on a backside of the reflecting layer.

5. The light-emitting device of claim 1, wherein the upper doped stack layer of the light emitting stack structure comprises a transparent conductive layer on top in contact with the first electrode.

6. The light-emitting device of claim 5, wherein the transparent conductive layer has a rough surface to improve a light emitting efficiency.

7. The light-emitting device of claim 1, further comprising an insulating layer, wherein the insulating layer is disposed on the magnetic-source layer and the light emitting stack structure is disposed on the insulating layer.

8. The light-emitting device of claim 1, wherein the magnetic-source layer is a magnetized material layer having a magnetization substantially perpendicular to the upper doped stack layer.

9. The light-emitting device of claim 1, wherein the magnetic-source layer is an external magnetic source without being physically connected to the light emitting stack structure.

10. The light-emitting device of claim 1, further comprising a bonding material layer on the first electrode and the second electrode of the light emitting stack structure.

11. The light-emitting device of claim 10, further comprising a substrate, wherein the light emitting stack structure is disposed on the substrate.

12. A light-emitting device, having magnetic-source, comprising:
a light emitting stack structure, having a first electrode and a second electrode distributed at a light output side of the light emitting stack structure; and
a magnetic-source layer, engaged with the light emitting stack structure to provide a magnetic field to the light emitting stack structure in a substantially perpendicular direction to the light emitting stack structure,
wherein the magnetic-source layer is larger than the first electrode and the second electrode.

13. The light-emitting device of claim 12, wherein the magnetic-source layer is packaged with light emitting stack structure.

14. The light-emitting device of claim 12, wherein the magnetic-source layer also serves as a carrier substrate.

15. The light-emitting device of claim 12, wherein the magnetic-source layer is stacked with light emitting stack structure.

16. The light-emitting device of claim 12, wherein the magnetic-source layer is an external magnetic source.

17. The light-emitting device of claim 12, wherein locations of the first electrode and the second electrode are set in accordance with the magnetic field to horizontally shift a driving current in the light emitting area.

18. A light-emitting device, comprising:
- a light emitting stack structure, having a first electrode, a second electrode, a lower doped stack layer, an upper doped stack layer, an active layer between the lower doped stack layer and the upper doped stack layer, wherein the first electrode and the second electrode are electrically coupled to the upper and the lower doped stack layers, respectively, and are disposed on a same side of the light emitting stack structure; and
- an external magnetic-source layer, which is not physically connected to the light emitting stack structure, to provide a magnetic field on the light emitting stack structure for adjusting a current path between the first electrode and the second electrode.

19. A light-emitting device, having magnetic-source, comprising:
- a light emitting stack structure, having a first electrode, a second electrode, a lower doped stack layer, an upper doped stack layer, an active layer between the lower and upper doped stack layers, wherein the first electrode and the second electrode are disposed on a same side of the light emitting stack structure, for producing a driving current; and
- a magnetic-source layer, providing a magnetic field to the light emitting stack structure in a direction substantially perpendicular to the upper doped stack layer, wherein the magnetic-source layer is larger than the first electrode and the second electrode.

\* \* \* \* \*